(12) United States Patent
Haseyama (10) Patent No.: US 7,304,487 B2
(45) Date of Patent: Dec. 4, 2007

(54) TEST METHOD OF SEMICONDUCTOR DEVICES

(75) Inventor: Makoto Haseyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 98 days.

(21) Appl. No.: 11/247,245

(22) Filed: Oct. 12, 2005

(65) Prior Publication Data

US 2006/0028223 A1 Feb. 9, 2006

Related U.S. Application Data (60) Division of application No. 10/677,378, filed on Oct. 3, 2003, now Pat. No. 6,975,126, which is a continuation of application No. PCT/JP01/02924, filed on Apr. 4, 2001.

(51) Int. Cl.
   *G01R 1/073* (2006.01)
   *G01R 31/28* (2006.01)
(52) U.S. Cl. ...................... 324/754; 324/765
(58) Field of Classification Search .................. None
   See application file for complete search history.

(56) References Cited

U.S. PATENT DOCUMENTS

| | | | |
|---|---|---|---|
| 4,227,149 A | 10/1980 | Faure et al. | |
| 4,471,298 A | 9/1984 | Frohlich | |
| 5,107,206 A | 4/1992 | Yanagi et al. | |
| 5,600,257 A * | 2/1997 | Leas et al. ................... | 324/754 |
| 5,825,192 A | 10/1998 | Hagiwara | |
| 6,084,419 A | 7/2000 | Sato et al. | |
| 6,130,543 A | 10/2000 | Lino | |
| 6,351,134 B2 | 2/2002 | Leas et al. | |
| 6,531,774 B1 | 3/2003 | Do et al. | |

FOREIGN PATENT DOCUMENTS

| | | |
|---|---|---|
| JP | 62-11243 | 1/1987 |
| JP | 63-57745 | 4/1988 |
| JP | 63-84946 | 6/1988 |
| JP | 7-130802 | 5/1995 |
| JP | 10-223704 | 8/1998 |

* cited by examiner

*Primary Examiner*—Ernest Karlsen
(74) *Attorney, Agent, or Firm*—Westerman, Hattori, Daniels & Adrian, LLP.

(57) ABSTRACT

A contactor apparatus having a first contactor (2) and a second contactor (4) acquires an electrical conduction to a plurality of semiconductor devices formed on a semiconductor wafer (6). The first contactor (2) has contacts (2b) which are directly brought into contact with power supply terminals (6a) of the semiconductor devices. The second contactor (4) is movable relative to the first contactor (2) and has contacts (4a) which are brought into contact with signal terminals (6b) of the semiconductor devices. Thereby, the number of contacts to be formed on a single contactor can be reduced and the number of pattern wirings can also be reduced, which makes the fabrication of the contactor easier.

6 Claims, 8 Drawing Sheets

FIG.13

TEST METHOD OF SEMICONDUCTOR DEVICES

This application is a divisional of application Ser. No. 10/677,378, filed Oct. 3, 2003, now U.S. Pat. No. 6,975,126, which is a continuation of International Application No. PCT/JP01/02924, filed Apr. 4, 2001.

TECHNICAL FIELD

The present invention relates to contactor apparatuses and, more particularly, to a contactor apparatus for acquiring an electric contact for each of a plurality of semiconductor devices formed on a wafer.

BACKGROUND ART

In recent years, in a manufacturing process of semiconductor devices, a technique has been developed for simplifying the manufacturing process of semiconductor devices by testing semiconductor devices in a wafer state. According to such a technique, a plurality of semiconductor devices formed on a single wafer are subjected to various semiconductor tests in a wafer state and also being subjected to packaging. Then, the semiconductor devices packaged in a wafer state is separated from each other. According to such a technique, the semiconductor devices can be managed on an individual lot basis. Additionally, a cost spent on the packaging of a defective semiconductor device can be eliminated.

Many semiconductor devices are formed on a single wafer in an aligned state. Electrodes such as power supply electrodes or an input and output signal electrodes are formed on each of the semiconductor devices. Therefore, in order to apply a test to the semiconductor devices while driving them, an electrical contact must be made with each of the semiconductor devices. That is, it is necessary to make a contact with the electrodes provided on each semiconductor device.

The number of the electrodes formed on one semiconductor device may be several hundreds when it is large. Moreover, more than hundreds of semiconductor devices are formed in one wafer. Therefore, in order to make a contact with an entire wafer simultaneously, the contact must be made with as many as several hundreds of thousands of electrodes at one time. Generally, in order to make a contact with electrodes of a semiconductor device, a contactor having contacts, which individually contact with respective electrodes of the semiconductor device, is used. Therefore, in order to make a contact with semiconductor devices in a wafer state simultaneously, it is necessary to form contacts of the same number as the number of the electrodes on the wafer on the contactor. That is, in order to test a wafer having several hundreds of thousands of electrodes, several hundreds of thousands of electrodes must be formed on the contactor.

Thus, in order to make a contact of such many contacts simultaneously, an extremely large pressure is needed. For example, if the contact pressure necessary for one contact point is several grams, a pressure of several hundreds kilograms must be applied for a contactor which contacts an entire wafer.

Moreover, when as many as several hundreds of thousands of contacts are formed on the contactor, pattern wirings must be formed on the contactor so as to electrically connect the contacts to external terminals. However, since a large area is needed for providing the pattern wirings, there is a problem in that it is difficult to form such many pattern wirings on one contactor.

DISCLOSURE OF THE INVENTION

It is a general object of the present invention to provide an improved and useful a contactor apparatus and a method for testing a semiconductor device.

A more specific object of the present invention is to provide a contactor apparatus which can be easily manufactured by reducing a number of contacts to be formed on a single contactor so as to reduce a number of pattern wirings.

In order to achieve the above-mentioned objects, there is provided according to one aspect of the present invention a contactor apparatus for acquiring electrical conduction to a plurality of semiconductor devices formed on a semiconductor wafer, comprising: a first contactor having contacts directly contacting terminals of a first system of the semiconductor devices; and a second contactor having contacts to be electrically connected to terminals of a second system of the semiconductor devices, the second contactor movable relative to the first contactor and having a separate path electrically independent from the first contactor.

According to the above-mentioned invention, contacts which are brought into contact with terminals formed on the semiconductor wafer can be distributed to the first contactor and the second contactor. Thus, the number of pattern wirings formed on each of the first contactor and the second contactor is smaller than the number of all terminals of the semiconductor wafer, and the pattern wirings of the first contactor and the second contactor can be easily formed. Therefore, according to the present invention, a contactor apparatus for testing a semiconductor wafer provided with great many terminals formed thereon can be easily manufactured.

The contactor apparatus according to the present invention may comprise a moving mechanism for sequentially moving the second contactor to positions corresponding to the plurality of semiconductor devices. Additionally, the first contactor is preferably a membrane contactor.

In one embodiment of the present invention, the first contactor has openings, and portions provided with the contacts of the second contactor are brought into contact with the terminals of the second system of the semiconductor devices through the openings.

Additionally, in another embodiment of the present invention, the first contactor has extending contacts extending from a surface of the first contactor facing the second contactor to a surface of the first contactor facing the semiconductor device, and the contacts of the second contactor is electrically connected to the terminals of the second system of the semiconductor devices by contacting the extending contacts. The contactor apparatus may further comprise a suction mechanism for attracting the first contactor toward the semiconductor wafer. The suction mechanism may comprise: a cassette to which the semiconductor wafer is attached; an elastic seal member provided to the cassette; and a suction passage connected to a space defined by the cassette, the first contactor and the elastic seal member, wherein the semiconductor wafer is located in the space.

Additionally, the contactor apparatus according to the present invention may comprise an elastic member located on a surface of the first contactor opposite to a surface facing the semiconductor wafer so as to apply a pressing force to the first contactor through the elastic member.

Further the contactor apparatus according to the present invention may comprise a sheet having an anisotropic conductivity and located on a surface of the first contactor opposite to a surface facing the semiconductor wafer, wherein the contacts is brought into contact with the contacts by pressing the contacts of the second contactor against the extending contacts.

Additionally, projection electrodes may be formed on the terminals of the first system of the semiconductor wafer and terminals of the second system, and the contacts of the first contactor may have concave surfaces corresponding to a shape of the projection electrodes so that the concave surfaces are brought into contact with the projection electrodes. Further, the extending contacts of the first contactor may have concave portions which are brought into contact with the contacts of the second contact.

Additionally, the contactor apparatus according to the present invention may comprise temperature control means for controlling a temperature of the semiconductor wafer.

According to one embodiment of the present invention, the temperature control means includes a fluid passage provided to the second contactor so as to locally perform a temperature of semiconductor wafer by supplying a fluid of a predetermined temperature to the fluid passage. Additionally, the temperature control means may include a temperature sensor which detects a temperature of the fluid discharged from the fluid passage so as to control the temperature of the fluid supplied to the fluid passage based on an output of the temperature sensor.

According to another embodiment of the present invention, the contactor apparatus comprise a cassette attached to the semiconductor wafer, wherein the temperature control means has a medium passage provided to the cassette so as to control the temperature of the semiconductor wafer by causing a medium of a predetermined temperature flowing through the medium passage. Additionally, the temperature control means may comprise a temperature control unit to which a cassette attached to the semiconductor wafer is removably attached, wherein the temperature control means has a medium passage provided to the temperature control unit so as to control the temperature of the semiconductor wafer by causing a medium of a predetermined temperature flowing through the medium passage.

Additionally, there is provided according another aspect of the present invention a test method for testing a plurality of semiconductor devices formed on a semiconductor wafer, comprising: a step of attaching the semiconductor wafer to a predetermined position of a cassette; a step of placing and fixing a first contactor to the semiconductor wafer, the first contactor having contacts which are directly brought into contact with power supply terminals formed on the semiconductor devices of the semiconductor wafer; a step of electrically connecting contacts of a second contactor to signal terminals formed on the semiconductor devices of the semiconductor wafer; and a step of testing the semiconductor devices by inputting signals to the semiconductor devices through the second contactor while supplying a power to the semiconductor devices through the first contactor so as to detect outputs corresponding to the signals.

In the above-mentioned invention, the step of testing may include a step of sequentially testing the semiconductor devices while moving the second contactor. Additionally, the step of testing may include a step of performing a test while controlling a temperature of the semiconductor wafer through the second contactor. Further, the step of testing may include a step of performing a test while controlling a temperature of the semiconductor wafer through the cassette.

Other objects, features and advantages of the present invention will become more apparent from the following detailed description when read in conjunction with the accompanying drawings.

BEST MODE FOR CARRYING OUT THE INVENTION

A description will be given below, with reference to the drawings, of embodiments of the present invention. It should be noted that equivalent structural components in the drawings are given the same reference numerals.

Figure 1:
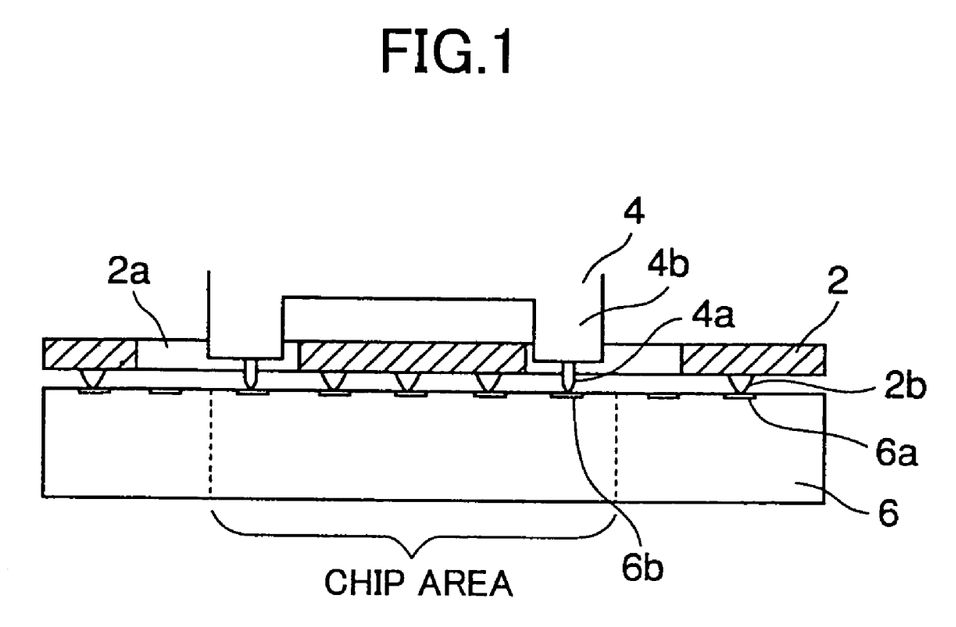
FIG. 1 is a cross-sectional view showing a structure of a contactor apparatus according to a first embodiment of the present invention.

FIG. 1 is a cross-sectional view showing a structure of a contactor apparatus according to a first embodiment of the present invention.

The contactor apparatus according to the first embodiment of the present invention comprises a first contactor 2 and a second contactor 4, and is configured to make a contact with a plurality of IC chips (semiconductor devices) in a wafer state. The first contactor 2 is configured to cover a substantially entire surface of a semiconductor wafer 6. On the other hand, the second contactor 4 is configured to make a contact with each of a plurality of semiconductor devices formed on the wafer 6, separately.

As shown in FIG. 1, the first contactor 2 is constituted by, for example, a membrane contactor, and makes a contact with predetermined electrodes of each IC chip in a wafer state. In the present embodiment, the contacts of the first contactor 2 are arranged so as to contact with power supply electrodes (power supply terminals) 6a of each IC chip. Therefore, each IC chip can be made into an operated state by contacting the first contactor 2 and supplying a voltage.

It should be noted that, in the first contactor 2, contacts 2b are formed by nickel or gold plating on a membrane. Thus, the thickness of the contactor 2 decreases by making the first contactor 2 of a membrane contactor, and the second contactor 4 is avoided from interfering with the first contactor 2 when moving the second contactor 4 with a small travel in a perpendicular direction as mentioned later.

The first contactor 2 has openings 2a in predetermined positions, and contacts 4a of the second contactor 4 is capable of contacting signal electrodes (signal terminals) 6b of each IC chip through the openings 2a. That is, the openings 2a are arranged so as to be located above the signal terminals 6b of each IC chip, and the contacts 4a of the second contactor 4 is capable of contacting the signal terminals 6b of each IC chip. It should be noted that the signal terminals 6b include signal I/O terminals and signal output terminals.

The second contactor 4 has projection parts 4b which are parts provided with contacts 4a as shown in FIG. 1, and the projection parts 4b are configured to be inserted into the openings 2a of the first contactor 2. The contacts 4a of the second contactor 4 are so-called pogopin type contacts which comprise pins elastically movable by coil springs, etc. Therefore, the contacts 4a of the second contactor 4 can obtain a stable contact due to a relatively large stroke.

It should be noted, as mentioned later, that the second contactor 4 sequentially moves to a position above an adjacent IC chip so as to make a contact after a test of one IC chip is completed. Thereby, a test can be performed on the IC chips on the semiconductor wafer 6 one after another. The second contactor 4 is moved by a moving mechanism 7, and descriptions with respect to a specific structure thereof will be omitted since the structure of the moving mechanism 7 can be achieved by a known structure.

Moreover, although the second contactor 4 shown in FIG. 1 is configured to make a contact with a single IC chip, a number of contacts corresponds to a plurality of IC chips may be provided to the second contactor 4. By doing so, a test can be performed on a plurality of IC chips simultaneously, and a number of travels of the second contactor 4 can be reduced, which reduces a time spent on the test.

Figure 2:
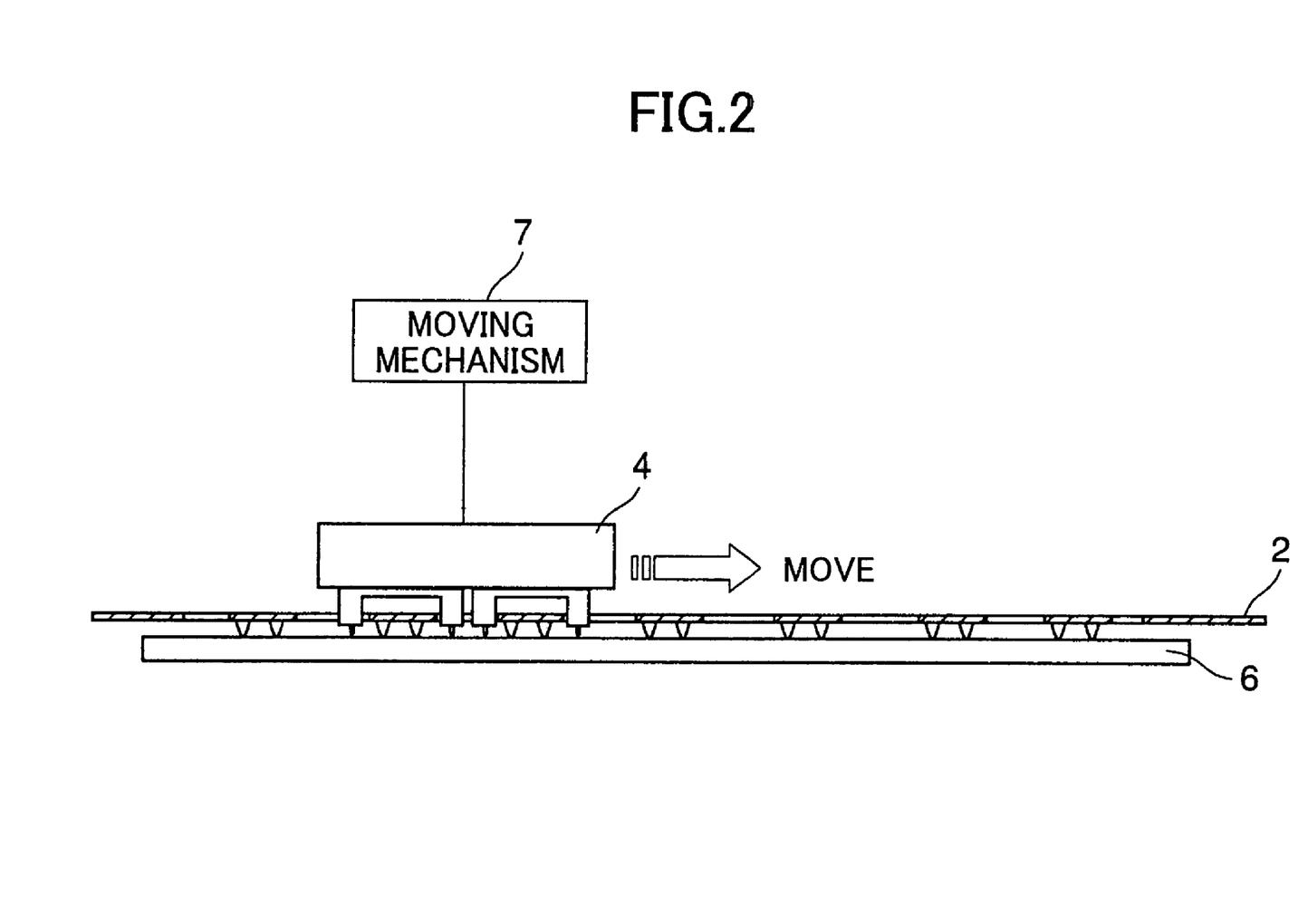
FIG. 2 is a view for explaining a second contactor of the contactor apparatus according to the first embodiment of the present invention.

FIG. 2 is a view for explaining a structure, which moves a second contactor of a contactor apparatus according to the first embodiment of the present invention. The first contactor 2 shown in FIG. 2 is a membrane contactor, which has contacts 2a at positions corresponding to power supply terminals of each IC chip of the semi semiconductor wafer 6. Moreover, the second contactor 4 shown in FIG. 2 is configured to be capable of make a contact with the signal electrodes 6b of two IC chips simultaneously.

Therefore, the first contactor 2 is first located on the wafer 6 so as to make a contact with the power supply terminals 6a of each IC chip, and supply a voltage to each IC chip so as to put each IC chip in an operating state. Next, the contacts 4a of the second contactor 4 are contacted with the signal terminals 6b of the IC chip to be tested so as to supply signals to predetermined signal input terminals, and the IC chip is tested by measuring outputs of the signal output terminals. When the test is completed (two IC chips are simultaneously tested in FIG. 2), the second contactor 4 is moved onto two adjacent IC chips so as to make a contact, and a test is performed similarly.

As mentioned above, according to the contactor apparatus according to the present embodiment, a function of one contactor is achieved by dividing into a first contactor which makes a contact with the power supply terminals 6a and the second contactor 4 which makes a contact with the signal terminals 6b, and, thus, the contacts which are provided correspondingly to the terminals formed in the entire semiconductor wafer 6 can be distributed to the first contactor 2 and the second contactor 4. Therefore, the number of contacts required for each of the first contactor 2 and the second contactor 4 is less than the number of terminals formed in the entire wafer, and the pattern wirings connecting the contacts can be easily formed in a small area.

Figure 3:
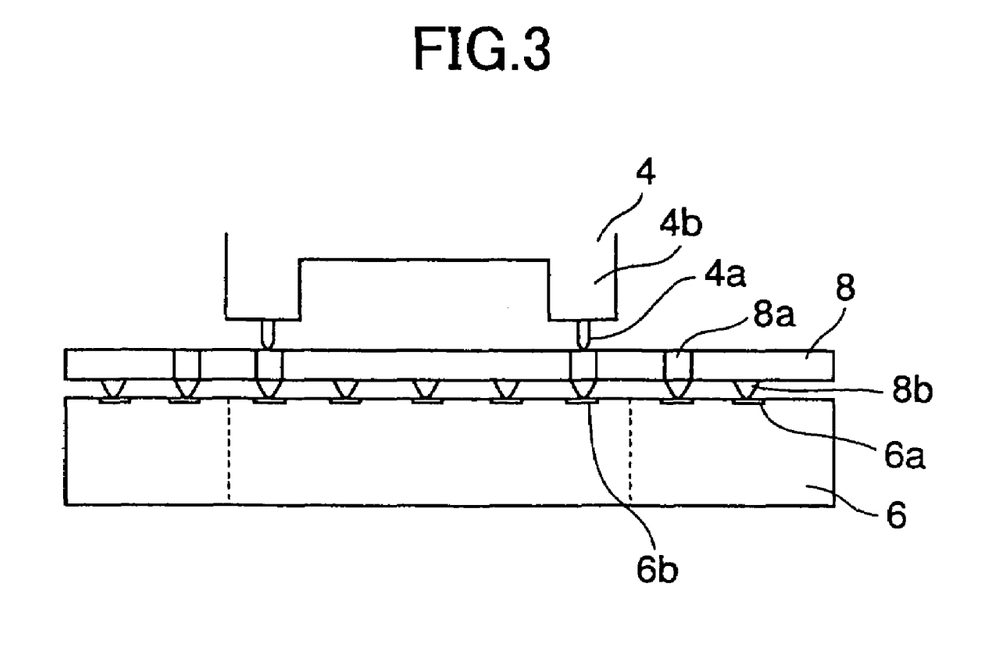
FIG. 3 is a cross-sectional view of a contactor apparatus according to a second embodiment of the present invention.

Next, a description will be given, with reference to FIG. 3, of a contactor apparatus according to a second embodiment of the present invention. FIG. 3 is a cross-sectional view showing a structure of the contactor apparatus according to the second embodiment of the present invention. In FIG. 3, parts that are the same as the parts shown in FIG. 2 are given the same reference numerals, and descriptions thereof will be omitted.

Similar to the above-mentioned first embodiment, the contactor apparatus according to the second embodiment of the present invention comprises a first contactor 8 and second contactor 4. Unlike the second contactor 2 shown in FIG. 1, the second contactor 8 does not have the openings 2a. Instead, the second contactor 8 has contacts 8a, which are brought into contact with power supply terminals 6a of the semiconductor wafer 6. Contacts 8a provided to the first contactor 8 extend through the first contactor 8 in a direction of the thickness thereof. One ends of the contacts 8a are arranged so as to be brought into contact with the signal terminals of the semiconductor wafer 6, and the other ends are exposed on a surface of the first contactor 8.

In the above-mentioned structure, the contacts 4a of the second contactor 4 are brought into contact with exposed portions of the first contactor 8. Thereby, the signal terminals 6b of the semiconductor wafer 6 are electrically conducted with the contacts 4a of the second contactor 4, which achieves a contact by the second contactor 4.

It should be noted that, although the first contactor 8 has the contacts 8a and 8b of the same number as the number of the terminals 6a and 6b of the semiconductor wafer 6 in the present embodiment, there is no need to provide the pattern wiring to the contacts 8b in the first contactor 8 since no signal is input from the first contactor to the contacts 8a. That is, the contacts 8b are located between the contacts 4a and the signal terminals 6b of the semiconductor wafer so as to electrically connect them. Moreover, although the second contactor 4 has the projection parts 4b in the example shown in FIG. 3, there is no need provide the projection parts 4b in the present embodiment since the contacts 4a are not necessarily inserted into the openings.

Figure 4:
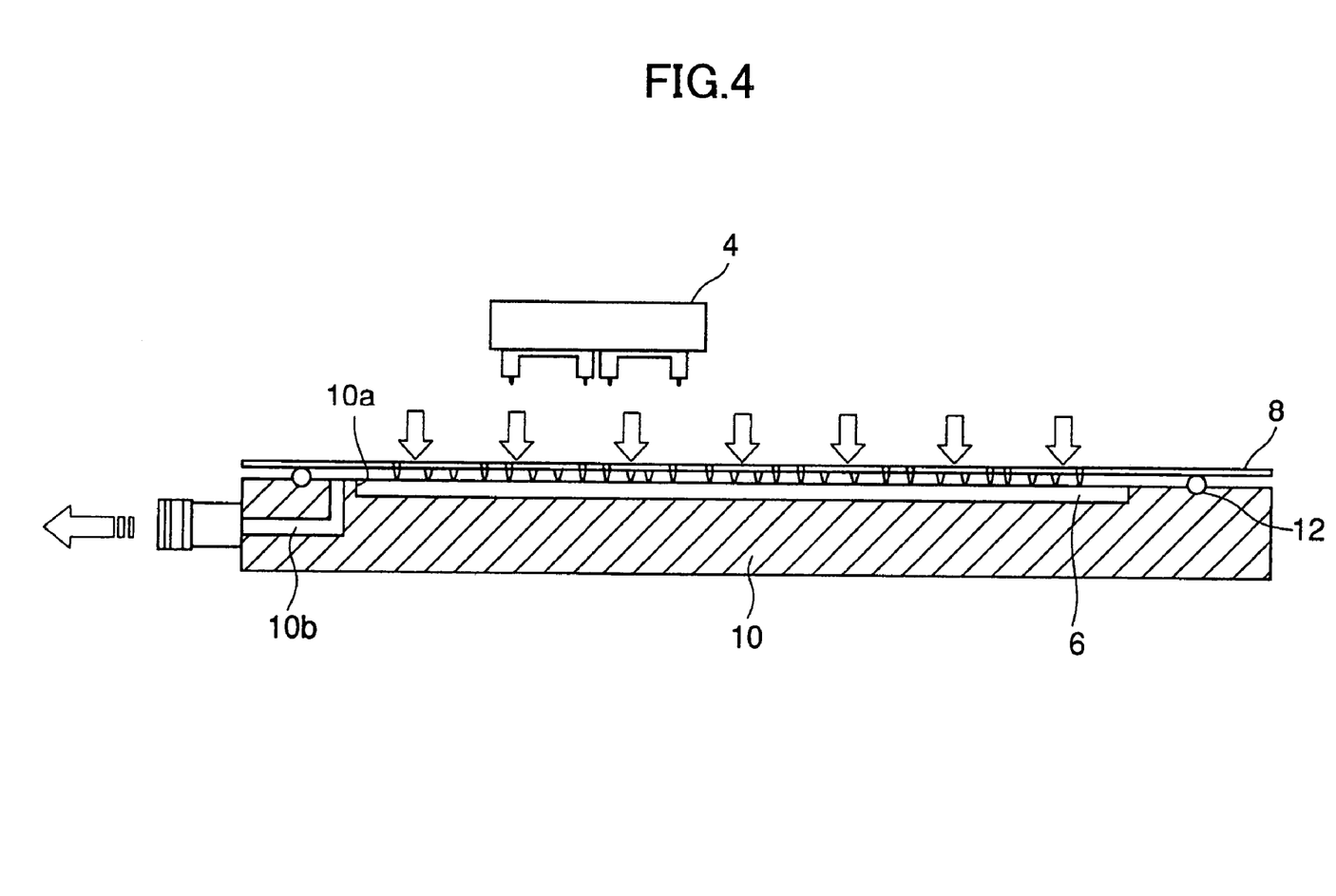
FIG. 4 is a view for explaining a structure of fixing a first contactor of the contactor apparatus according to the second embodiment.

FIG. 4 is a view for explaining a structure for fixing the first contactor 8 of the contactor apparatus according to the second embodiment of the present invention. The first contactor 8 shown in FIG. 4 is a membrane contactor, and has the contacts 8b in the positions corresponding to the power supply terminals 6a of each IC chip of the semiconductor wafer 6. Additionally, the second contactor 4 shown in FIG. 4 is configured to be capable of make a contact with the signal terminals 6b of two IC chips simultaneously.

First, since the first contactor 8 is fixed onto the semiconductor wafer 6, the semiconductor wafer 6 is arranged on a cassette 10 of a testing apparatus. An O-ring 12 having a diameter greater than the diameter of the semiconductor wafer 6 but smaller than the diameter of the first contactor is attached to the cassette 10. The semiconductor wafer 6 is accommodated in a recessed-part 10a formed inside the O-ring 12, and the first contactor 8 is placed above the recessed-part 10a so as to cover the semiconductor wafer 6 and the O-ring 12. It should be noted that the O-ring 12 is an elastic seal member formed of a material having heat resistance such as silicon rubber.

In this state, the first contactor 8 is positioned so that the contacts 8a and 8b of the first contactor 8 make a contact with the power supply terminals 6a and the signal terminals 6b of the wafer 6. Then, an evacuation of a space defined by the first contactor 8, the semiconductor wafer 6 and the O-ring 12 is carried out. That is, the cassette 10 is provided with a suction passage 10b for evacuation, and the above-mentioned space is maintained at a negative pressure by connecting a vacuum pump (suction pump) to the suction passage 10b. Therefore, the first contactor 8 is fixed to the cassette 10 (that is, the semiconductor wafer 6) by being pressed entirely toward the semiconductor wafer 6 by an atmospheric pressure (that is, by being attracted toward the semiconductor wafer 6). Simultaneously, the contacts 8a and 8b of the first contactor 8 contact positively the power source terminals 6a and the signal terminals 6b on the semiconductor wafer 6. It should be noted that the above-mentioned cassette 10, O-ring 12 and suction passage 10b provided to the cassette 10 constitute a suction mechanism.

Next, each IC chip is changed into an operating-state by supplying a power source voltage to the power supply terminals 6a of each IC chip through the first contactor 8. Then, the contacts 4a of the second contactor 4 are brought into contact with the signal terminals 6b (signal input terminals) of the IC chip to be tested so as to supply a predetermined signal, and perform the test by measuring outputs from the signal terminals 6b.

Upon completion of the test (two IC chips are tested simultaneously in FIG. 4), the second contactor 4 is moved to a position above the adjacent two IC chips so as to make a contact and a test is carried out in the same manner. As mentioned above, according to the contactor apparatus according to the present embodiment, since a function as a single contactor is achieved by dividing the contactor into the first contactor 8 which makes a contact with the power supply terminal 6a and the second contactor 4 which makes a contact with the signal terminals 6b, all terminals formed on the entire semiconductor wafer 6 can be distributed to the first contactor 8 and the second contactor 4. Therefore, the number of the pattern wiring which should be formed in the first contactor 8 becomes less than the number of the terminals formed in the whole wafer. Moreover, the number of the contacts necessary for the second contactor 4 is smaller than the number of terminals formed on the entire wafer, and the number of pattern wirings is also reduced. Therefore, the pattern wirings connected to the contacts corresponding to the terminals formed on the semiconductor wafer 6 is distributed to the first contactor 8 and the second contactor 4, which allows easy formation of the pattern wirings.

Next, a description will be given of variations of the contactor apparatuses according to the above-mentioned first and second embodiments.

Figure 5:
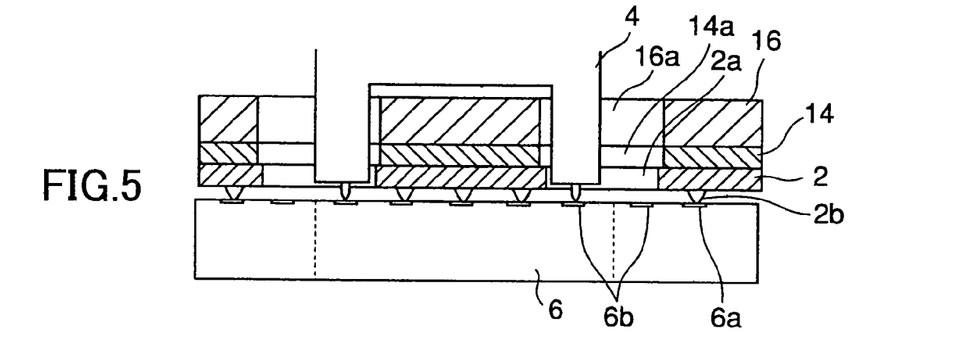
FIG. 5 is a cross-sectional view showing a structure of a contactor apparatus which is a variation of the first embodiment of the present invention.

FIG. 5 is a cross-sectional view showing a structure of a contactor apparatus according to a variation of the above-mentioned first embodiment. The contactor apparatus shown in FIG. 5 is provided with an elastic board 14 which is formed of silicon rubber or plastics on the first contactor 2 and a press board 16 formed of a rigid material thereon. By pressing the press board 16 toward the semiconductor wafer 6, a contact pressure of the first contactor 2 can be easily obtained using the elasticity of the elastic board 14. It should be noted that the elastic board 14 and the press board 16 are provided with openings 14a and 16a in positions corresponding to the opening 2a of the first contactor 2, respectively.

Figure 6:
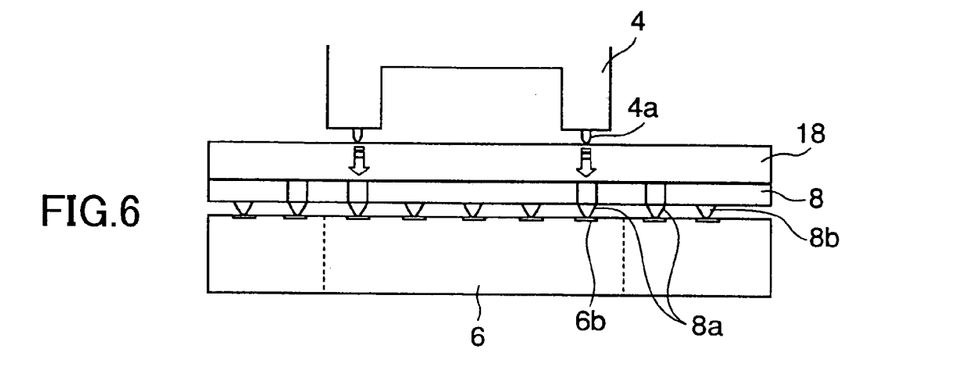
FIG. 6 is a cross-sectional view showing a structure of a contactor apparatus which is a first variation of the second embodiment of the present invention.

FIG. 6 is a cross-sectional view showing a structure of a contactor apparatus according to a first variation of the above-mentioned second embodiment. The contactor apparatus shown in FIG. 6 is provided with the elastic board 18 having an anisotropic conductivity on the first contactor 8. That is, the contacts 4a of the second contactor 4 can be easily brought into contact with the signal terminals 6b of the semiconductor wafer 6 by pressing the contacts 4a of the second contactor 4 against the contacts 8a contacting the signal terminals 6b of the semiconductor wafer 6 through the elastic board 18 having an anisotropic conductivity.

In the example shown in FIG. 6, there is no need to form the contacts 4a of the second contactor 4 as a pogopin type, and the contacts 4a may be fixed pins. Additionally, a press board having openings such as shown in FIG. 5 may be provided on the elastic board 18 so as to press portions corresponding to the contacts 8b.

Figure 7:
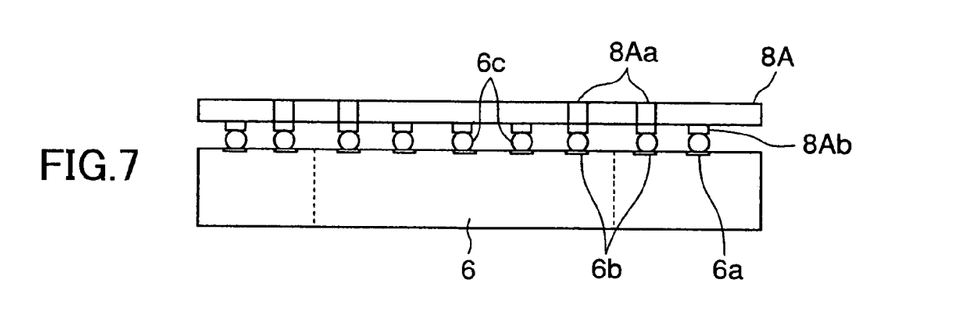
FIG. 7 is a cross-sectional view showing a structure of a contactor apparatus which is a second variation of the second embodiment of the present invention.

FIG. 7 is a cross-sectional view showing a structure of a contactor apparatus according to a second variation of the above-mentioned second embodiment. Illustration of the second contactor 4 is omitted in FIG. 7. The contactor shown in FIG. 7 is used when projection electrodes 6c like solder balls are formed on electrodes 6a and 6b of the IC chips of the semiconductor wafer 6. Namely, a end portion of each of the contacts 8Aa and 8Ab is processed into a form which matches the rounded shape of the projection electrodes 6c. Thereby, a contact by a large contact area can be attained without damaging projection electrodes 6c.

It should be noted that the shape of the contacts 8Ab can be applied to the contacts 2b provided to the first contact 2 shown in FIG. 1. That is, when the projection electrodes are formed on the electrodes of the semiconductor wafer shown in FIG. 1, the shape of the ends of the contacts 2b provided to the first contactor 2 is made into the same shape as the contacts 8Ab. In this case, it is preferable that the shape of the ends of the contacts 4a of the second contactor 4 be also made into the same shape as the contacts 8Ab.

Figure 8:
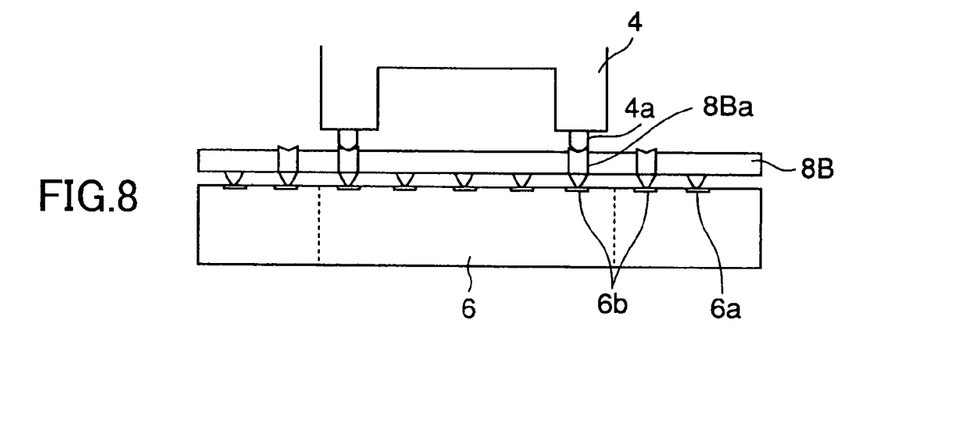
FIG. 8 is a cross-sectional view showing a structure of a contactor apparatus which is a third variation of the second embodiment of the present invention.

FIG. 8 is a cross-sectional view showing a structure of a contactor apparatus according to a third variation of the above-mentioned second embodiment. In the contactor apparatus shown in FIG. 8, a recessed-part is formed in a surface of each of the contacts 8Ba of the first contactor 8B on the side of the second contact 4. The end portions of the contacts 4a of the second contactor 4 have a convex shape corresponding to the recessed-parts of the contacts 8Ba. Thereby, contacts 4a of the second contactor 4 can be accurately positioned to the contacts 8Ba, thereby making a reliable contact.

It should be noted that although the recessed-parts are formed on the contacts 8Ba so as to make the end potions of the contacts 4a into the convex shape, the same effect can be obtained by forming recessed-parts on the end portions of the contacts 4a and making the contacts 8Ba into a convex shape.

Next, a description will be given, with reference to FIGS. 9A, 9B and 9C, of a test method using the contactor apparatuses according the above-mentioned first or second embodiment. Although the contactor apparatus according to the second embodiment is used in the example shown in FIGS. 9A, 9B and 9C, a test method with respect to the contactor apparatus according to the first embodiment is the same.

Figure 9A:
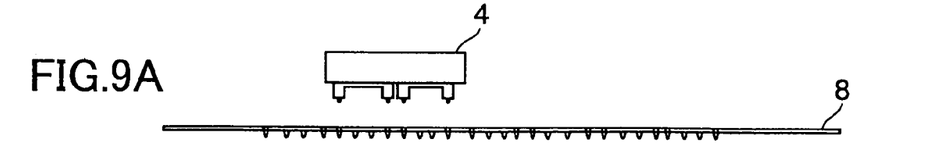
FIGS. 9A, 9B and 9C are views for explaining a testing method of a semiconductor device using the contactor apparatus according to the second embodiment of the present invention.
Figure 9B:
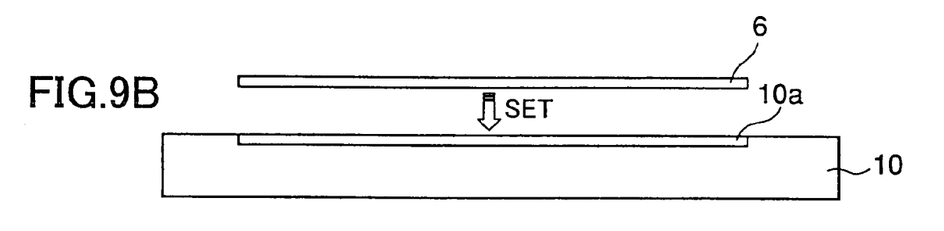
Figure 9C:
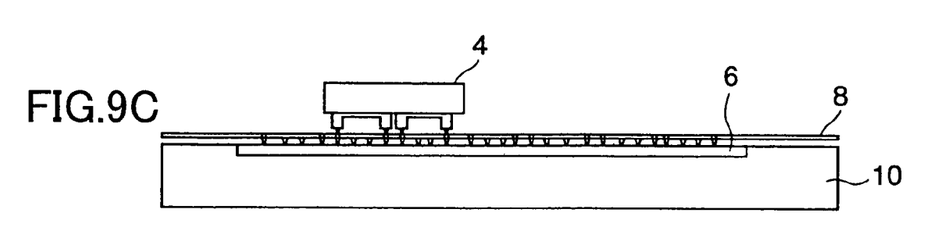

First, as shown in FIG. 9A, the first contactor 8 and the second contactor 4 are prepared. Next, as shown in FIG. 9B, the semiconductor wafer 6 having IC chips to be tested is placed in the recessed-part 10a of the cassette 10. Thereby, positioning of the semiconductor wafer 6 is performed. Then, as shown in FIG. 9C, the first contactor 8 is pressed against the semiconductor wafer 6.

That is, the contacts 8a and 8b of the first contactor 8 are brought into contact with the power supply terminals 6a and the signal terminals 6b of the semiconductor wafer 6. Then, the second contactor 4 and the IC chip of the semiconductor wafer 6 is made into a conducting-state by bringing the contacts 4a of the second contactor 4 into contact with the contacts 8a of the first contactor 8. Thereby, signals can be supplied to the input signal terminals of the IC chip through the second contactor 4 so that outputs from the output terminals can be checked with respect to the input. Then, the test is carried out sequentially to the IC chips of the semiconductor wafer 6 while moving the second contactor 4.

Next, a description will be given of an example in which a temperature control means is provided to the contactor apparatuses according to the above-mentioned first and the second embodiments. The temperature control means is a means for controlling a temperature of IC chip to be tested, and there may be a case in which the IC chip is heated or a case in which the IC chip is cooled.

Figure 10:
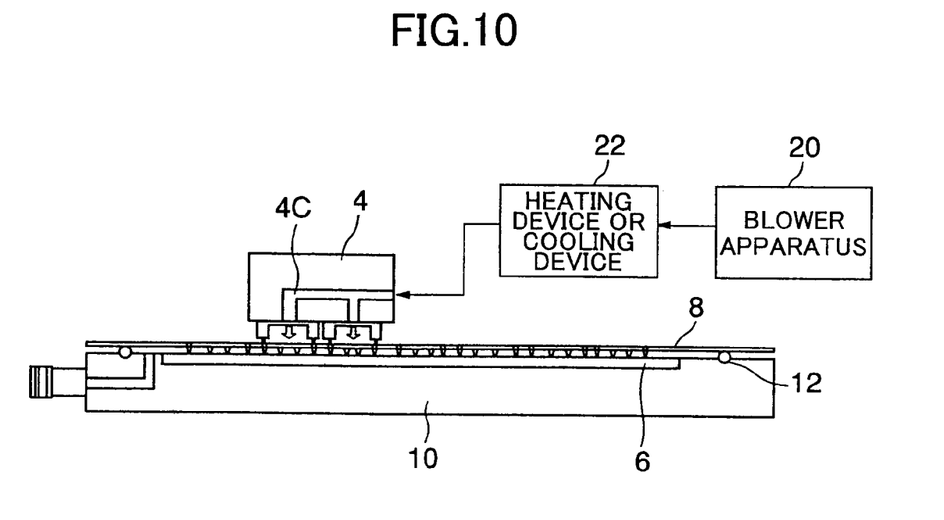
FIG. 10 is a cross-sectional view showing an example in which a temperature controlling means is provided in a second contactor.

FIG. 10 is a cross-sectional view showing an example in which the temperature control means is provided to the second contactor 4. That is, the second contactor 4 shown in FIG. 10 is provided with an air passage 4c for supplying a temperature-controlled. The air passage 4c is connected to a blower apparatus 20 so that an air supplied from the blower apparatus 20 is discharged from the second contactor through the air passage 4C. Here, the air supplied to the air passage 4c is heated or cooled by a heating device such as an electric heater or a cooling device 22, and supplied to the air passage 4c. The heating apparatus and the cooling apparatus can be achieved by a single device by utilizing a Peltier element.

Discharge ports of the air passage 4c are arranged so as to be in positions on the first contactor 8, which are directly above the IC chips to be tested. Therefore, the IC chips contacted by the second contactor 4 are heated or cooled by the air discharged from the air passage 4c. Thereby, only the IC chip to be tested can be temperature-controlled, which allows setting of a more wider test temperature conditions.

Figure 11:
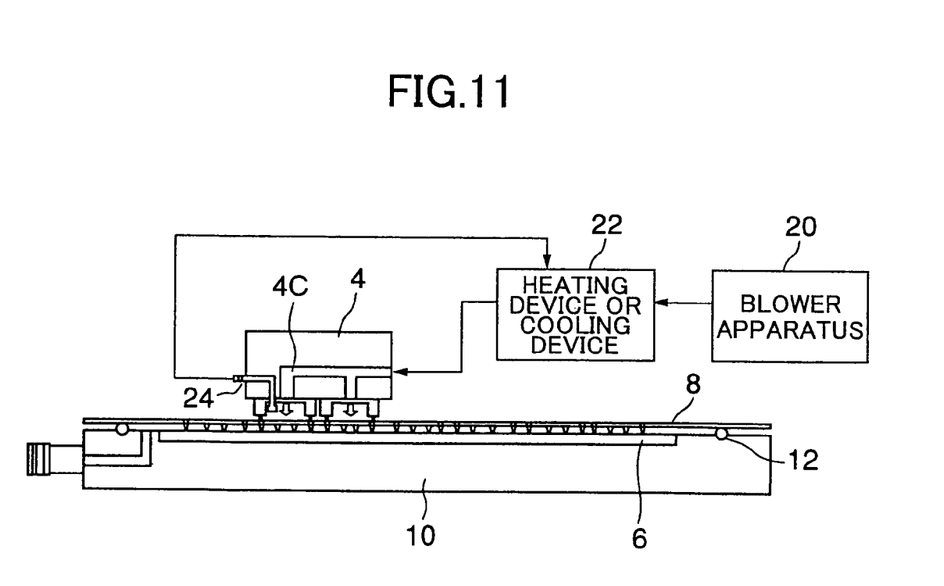
FIG. 11 is a cross-sectional view showing an example in which a temperature sensor is provided in the second contactor shown in FIG. 10.

FIG. 11 is a cross-sectional view showing an example in which a temperature sensor 24 is provided to the second contactor 4 shown in FIG. 10. The temperature sensor 24 is located near the discharge ports of the air passage 4c so as to detect a temperature of the air discharged from the discharge ports. The output of the temperature sensor 24 is sent to the heating device or the cooling device 22. The heating device or the cooling device 22 controls the temperature of the air from the blower apparatus 20 based on the output from the temperature sensor 24. Therefore, the temperature of the air discharged from the air passage 4c is controlled accurately by a feed-back control using the output of the temperature sensor 24. Thereby, the temperature of the IC chips tested by the second contactor 4 can be accurately controlled.

It should be noted that although the temperature controlled air is supplied to the second contactor in the example shown in FIG. 10 and FIG. 11, a predetermined gas such as an inert gas or nitrogen may be supplied instead of air. In this case, the blower apparatus 20 is replaced by a gas supply source of the predetermined gas supplied to the heating device or the cooling device 22.

Figure 12:
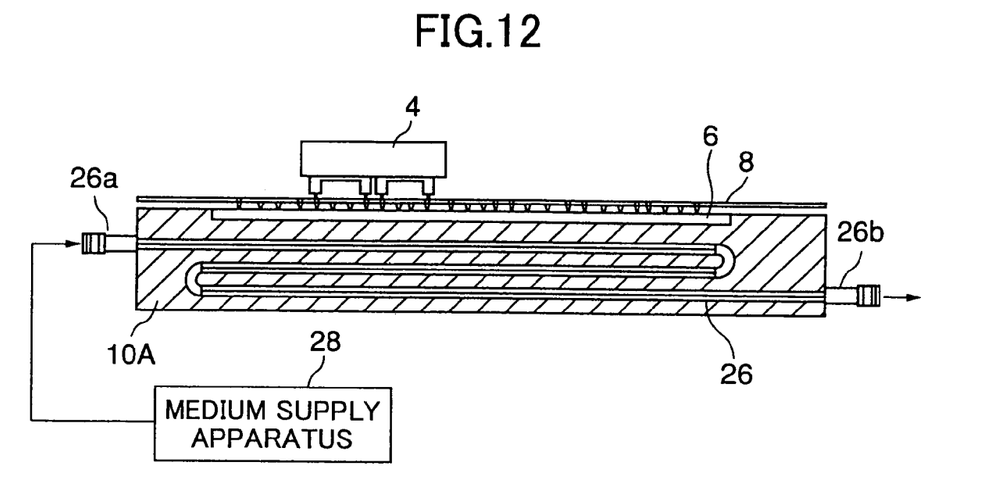
FIG. 12 is a cross-sectional view showing an example in which a temperature controlling means is provided in a cassette to which a semiconductor wafer is attached.

FIG. 12 is a cross-sectional view showing an example in which a temperature control means is provided to the cassette to which the semiconductor wafer 6 is attached. That is, the cassette 10A shown in FIG. 12 is provided with a medium passage 26 for flowing a medium (for example, a cooling medium) for controlling a temperature of the semiconductor wafer 6. A medium which is controlled to a predetermined temperature is supplied from a medium supply apparatus 28 to a supply port 26a of the medium passage 26.

The medium flows through the medium passage 26 and is discharged from an outlet port 26b. The temperature of the cassette 10A is controlled by the medium which flows through the medium passage 26, and, thereby, the temperature of the semiconductor wafer 6 attached to the cassette 10A is controlled. Therefore, the temperature of the semiconductor wafer 6 can be controlled by controlling the temperature of the medium supplied from the medium supply apparatus 28.

Figure 13:
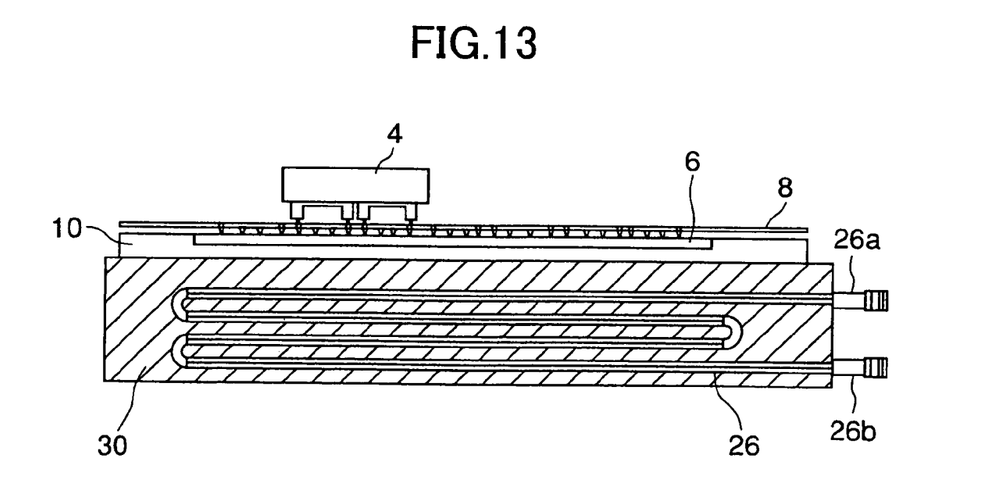
FIG. 13 is a cross-sectional view showing an example in which a medium passage is provided in a unit different from the cassette.

FIG. 13 is a cross-sectional view of an example in which a medium passage is provided to a unit different from a cassette. That is, in FIG. 13, the medium passage 26 is provided to a temperature control unit 30, and the cassette 10 is removably attached to the temperature control unit 30. According to the example shown in FIG. 13, since the medium passage 26 is not provided to the cassette 10, the cassette 10 can be made into a simple structure.

It should be noted that the IC chip tested by the second contactor 4 can be further locally temperature-controlled while temperature-controlling the entire semiconductor wafer 6 by combining the structure shown in FIGS. 12 and 13 with the structure shown in FIG. 11 or 12. Thereby, a temperature of the IC chips subjected to a test can be accurately controlled.

The present invention is not limited to the specifically disclosed embodiments, and variations and modifications may be made within the scope of the present invention.

The invention claimed is:

1. A test method for testing a plurality of semiconductor devices formed on a semiconductor wafer, comprising;
   a step of attaching said semiconductor wafer to a predetermined position of a cassette;
   a step of placing and fixing a first contactor to said semiconductor wafer, the first contactor having contacts which are directly brought into contact with power supply terminals formed on the semiconductor devices of said semiconductor wafer;
   a step of electrically connecting contacts of a second contactor to signal terminals formed on the semiconductor devices of said semiconductor wafer; and
   a step of testing said semiconductor devices by inputting signals to said semiconductor devices through said second contactor while supplying a power to said semiconductor devices through said first contactor so as to detect outputs corresponding to the signals; wherein pattern wirings connected to the first and second contactors corresponding to the terminals formed on the semiconductor wafer is distributed to the first contactor and the second contactor.

2. The test method as claimed in claim 1, wherein the step of testing includes a step of sequentially testing said semiconductor devices while moving said second contactor.

3. The test method as claimed in claim 1, wherein the step of testing includes a step of performing a test while controlling a temperature of said semiconductor wafer through said second contactor.

4. The test method as claimed in claim 1, wherein the step of testing includes a step of performing a test while controlling a temperature of said semiconductor wafer through said cassette.

5. The test method as claimed in claim 2, wherein the step of testing includes a step of performing a test while controlling a temperature of said semiconductor wafer through said second contactor.

6. The test method as claimed in claim 2, wherein the step of testing includes a step of performing a test while controlling a temperature of said semiconductor wafer through said cassette.

* * * * *